United States Patent [19]
Ramesh

[11] Patent Number: 5,479,317
[45] Date of Patent: Dec. 26, 1995

[54] FERROELECTRIC CAPACITOR HETEROSTRUCTURE AND METHOD OF MAKING SAME

[75] Inventor: Ramamoorthy Ramesh, Tinton Falls, N.J.

[73] Assignee: Bell Communications Research, Inc., Livingston, N.J.

[21] Appl. No.: 318,587

[22] Filed: Oct. 5, 1994

[51] Int. Cl.$^6$ .................................................. H01G 4/06
[52] U.S. Cl. ............................. 361/321.5; 29/25.42
[58] Field of Search ................... 361/311–313, 321.1, 361/321.2, 321.3, 321.4, 321.5; 365/145; 257/295; 29/25.42; 437/919

[56] References Cited

U.S. PATENT DOCUMENTS

| | | | |
|---|---|---|---|
| 5,005,102 | 4/1991 | Larson | 361/313 |
| 5,155,658 | 10/1992 | Inam et al. | 365/145 |
| 5,169,485 | 12/1992 | Allen et al. | 156/603 |
| 5,248,564 | 9/1993 | Ramesh | 428/688 |
| 5,270,298 | 12/1993 | Ramesh | 505/1 |

*Primary Examiner*—Bot L. Ledynh
*Attorney, Agent, or Firm*—Leonard Charles Suchyta; Lionel N. White

[57] ABSTRACT

A ferroelectric capacitor heterostructure useful in fabricating high-density, non-volatile memory devices is improved by the interposition of an epitaxially-grown layer of oriented platinum which provides the level of electrical conductivity necessary for incorporation of such devices into integrated circuit structures. The reliability of the ferroelectric capacitor device is further improved by maintaining appropriate oxygenation during the fabrication process to ensure the symmetry of the ferroelectric hysteresis loop and thereby provide optimum control of such significant properties as aging, retention, imprint, and fatigue.

10 Claims, 4 Drawing Sheets

FERROELECTRIC CAPACITOR HETEROSTRUCTURE AND METHOD OF MAKING SAME

BACKGROUND OF THE INVENTION

Ferroelectric thin films of high crystalline quality have recently been grown on silicon substrates using suitable combinations of buffer layers and templates to initiate the crystallization and formation of the desired material phase in a proper crystallographic orientation. For example, yttria-stabilized zirconia (YSZ) has been used as a buffer layer on a chemically cleaned [100] Si wafer to provide a crystalline template for the growth of subsequent layers of cuprate superconductors, such as yttrium-barium-cuprate (YBCO). In U.S. Pat. No. 5,155,658, a high crystalline quality, c-axis oriented YBCO was used as a structural template for subsequent growth of a pseudo-cubic lead zirconium titanate (PZT) perovskite ferroelectric layer and a covering YBCO electrode layer to yield a ferroelectric memory element. High growth temperatures presented a problem in Si-CMOS processing, however.

Improved, lower temperature crystalline growth was later achieved with cubic metal oxides, such as lanthanum-strontium-cobalt oxide (LSCO), employing a layered perovskite, e.g., bismuth titanate (BTO), template layer to initiate c-axis orientation in LSCO and PZT ferroelectric overlayers, as described in U.S. Pat. No. 5,270,298. Further improvement in the growth of ferroelectric devices was realized in U.S. Pat. No. 5,248,564 through the use of lead-lanthanum-zirconium-titanate (PLZT) in a LSCO/PLZT/LSCO heterostructure which could be compatibly formed on a CMOS SiO/Si substrate by means of the layered BTO, or similar bismuth tungstate (BWO), template.

Although the temperature limitations had thus been surmounted and CMOS compatibility achieved, the electrical conductivity of the heterostructure on a SiO$_2$/Si substrate was insufficient for effective integrated circuit application. By means of the present invention, however, this shortcoming has been remedied and the ferroelectric heterostructure materials have been improved further through controlled crystal growth processing.

SUMMARY OF THE INVENTION

It has been discovered in the present invention that a strongly oriented [002] thin film of platinum can be grown upon an amorphous SiO$_2$ substrate surface by means of a layered perovskite, e.g., BTO, template interlayer in order to provide the desired electrical sheet conductivity needed to support CMOS circuit integration. At about 640°–680° C. the BTO is grown to a c-axis oriented layer about 30–50 nm thick which then supports the strongly-oriented [002] growth of the platinum thin film at about 580°–640° C. The platinum film can thereafter support the highly-oriented crystallographic growth of any number of metallic ferroelectric capacitor electrode materials, such as LSCO, LaSrCrO$_3$, and SrRuO$_3$, as well as that of the intermediate perovskite ferroelectric layer of, for example, PLZT.

It has also been discovered that the manner of processing the layered heterostructure growth has considerable effect upon the ferroelectric performance of a resulting device, particularly in its reliability as manifest in such properties as fatigue, aging, retention, and imprint. This latter property, which arises for the most part from an imbalance in the symmetry of the hysteresis loop of the ferroelectric structure, has been found to be highly responsive to an oxygenating atmosphere in which the growth layer is cooled to its operating ambient. A substantially symmetrical hysteresis loop can be achieved by cooling a heterostructure from its growth temperature of about 640°–680° C. to room temperature in an oxygen partial pressure of about $1\times10^2$ to $1\times10^5$ pascals (Pa).

BRIEF DESCRIPTION OF THE DRAWING

The present invention will be described with reference to the accompanying drawing of which.

DESCRIPTION OF THE INVENTION

Figure 1:
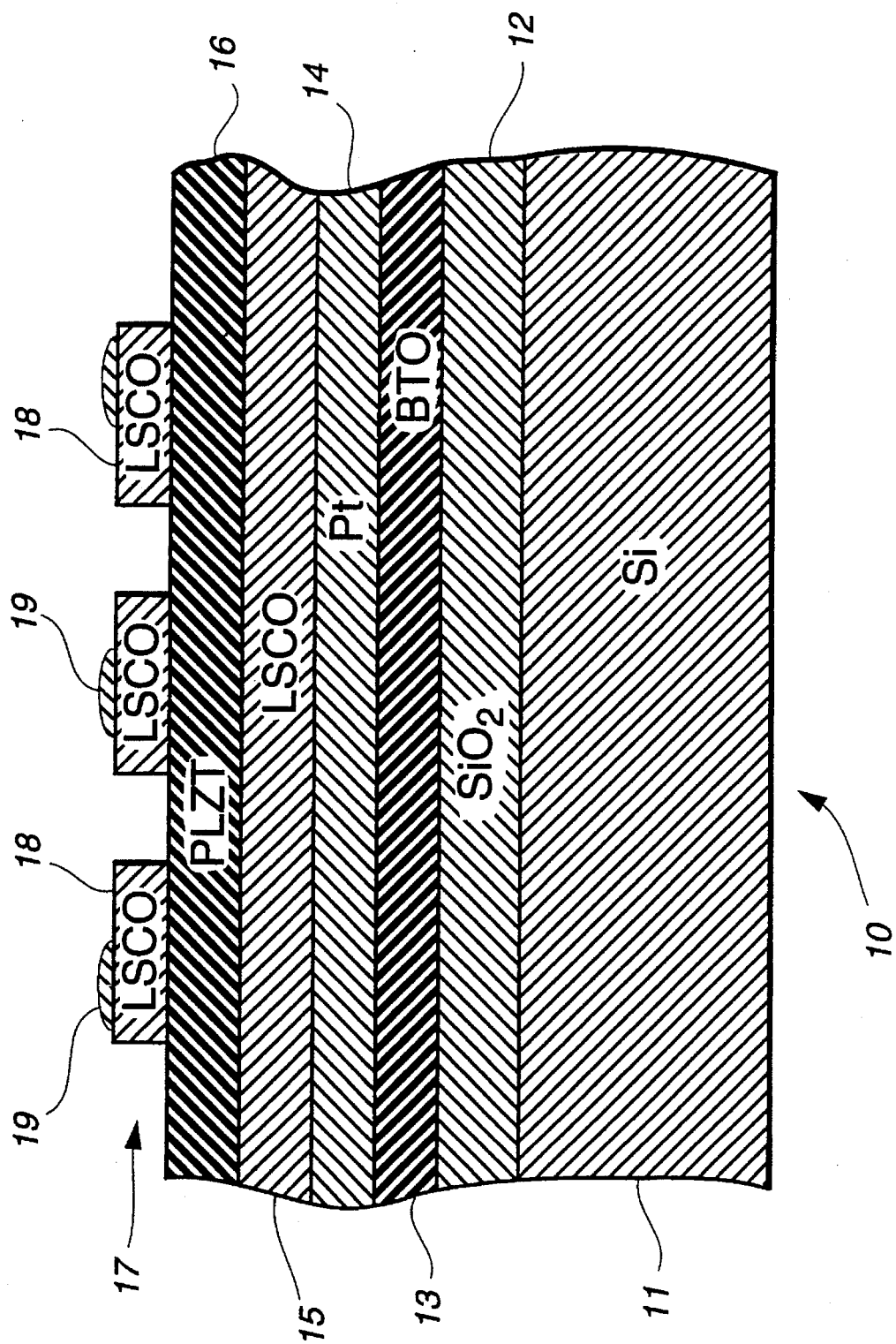
FIG. 1 is a representative elevational section of a ferroelectric heterostructure of the present invention.

A typical ferroelectric heterostructure memory element 10 prepared according to the present invention is shown in FIG. 1 comprising as a substrate a single crystal oriented [100] silicon wafer 11 the surface of which has been thermally wet oxidized to form an electronic grade amorphous SiO$_2$ layer 12 of about 100 nm thickness. Upon this surface at a temperature of about 630°–690° C. was grown a layer 13 of about 50 nm of bismuth titanate (BTO), typically Bi$_4$Ti$_3$O$_{12}$, using pulsed laser deposition (PLD), although other common techniques, such as sputtering, chemical vapor deposition (CVD), and electron-beam deposition, could similarly be employed. The c-axis orientation of the BTO layer was confirmed by x-ray diffraction testing and the sample was mounted in an ion-beam deposition chamber where, at a temperature of about 450°–600° C., a 50–150 nm layer 14 of platinum metal was grown on the BTO template layer 13. X-ray diffraction examination confirmed that the platinum was very strongly (002) oriented.

The sample was returned to the PLD apparatus where, at a temperature of about 630°–690° C. and in an atmosphere of about 13.3 Pa oxygen partial pressure, a first electrode layer 15 of LSCO, typically La$_{0.5}$Sr$_{0.5}$CoO$_3$, was grown on the Pt layer 14 to a thickness of about 50–150 nm, preferably about 100 nm. Other known metal oxide electrode materials, such as SrRuO$_3$ and LaSrCrO$_3$, would be equally viable. A ferroelectric layer 16 of PLZT followed at about 100–500 nm, typically 300 nm. The composition of the PLZT material was Pb$_{0.9}$La$_{0.1}$Zr$_{0.2}$Ti$_{0.8}$O$_3$ in this example, but could be varied over a wide range depending on the intended application. Other ferroelectric materials, such as barium titanate, barium strontium titanate, and bismuth titanate, could similarly be employed for layer 16 in high dielectric constant capacitor applications and in pyroelectric detectors. A top electrode layer 17 of about 100 nm LSCO was then grown and the completed heterostructure was cooled to ambient temperature at an optimum rate of about 10°–20° C./min in an atmosphere of about $1\times10^5$ Pa O$_2$. X-ray diffraction examination of the completed heterostructure confirmed that the ferroelectric stack was fully c-axis oriented.

Using a common photolithographic process, 50 μm diameter test capacitor electrodes 18 were fashioned of the upper LSCO layer 17 upon which Pt/Au electrical contacts 19 were deposited. Complementary contact with bottom electrode layer 15 was established by capacitive coupling through a large conductive pad, not shown, elsewhere on the surface of the structure. Typical ferroelectric testing of the capacitor heterostructure showed very desirable fatigue, aging, and retention properties which were eminently suitable for long term, non-volatile memory application. Remnant polarization values of about 15°–20° C./cm$^2$ at 5 V exhibited by the device are quite sufficient for this purpose. Additional testing at more extreme conditions of elevated temperature and the presence of dc bias showed equally satisfactory results. At about 100° C., for example, the device showed good read-write endurance over at least $10^{11}$ cycles.

Figure 2:
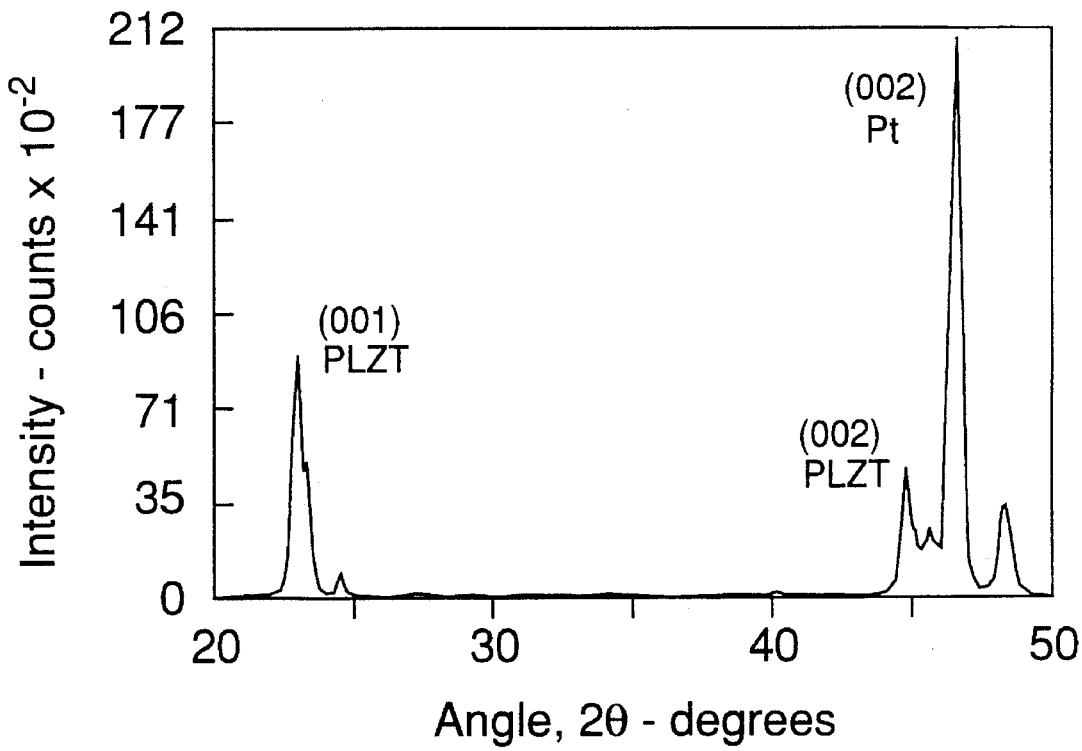
FIG. 2 is a representative X-ray diffraction pattern of a highly-oriented platinum layer obtained from template growth according to the present invention.
Figure 3:
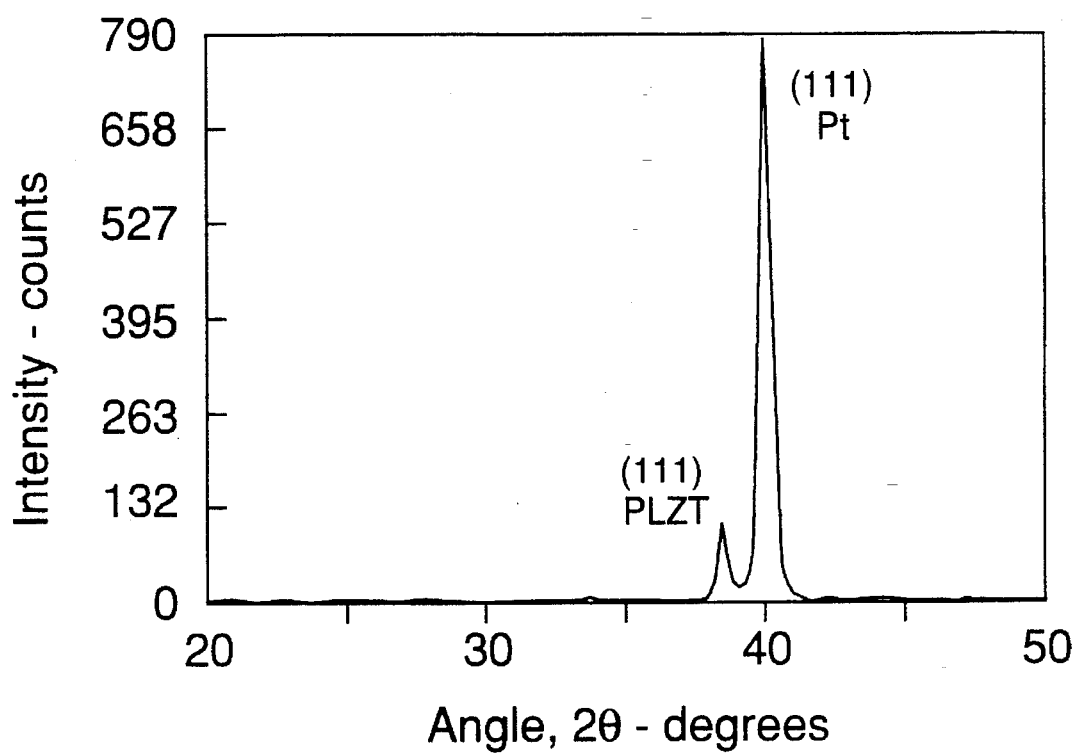
FIG. 3 is a representative x-ray diffraction pattern of a weakly-oriented platinum layer resulting from non-template growth.
Figure 4:
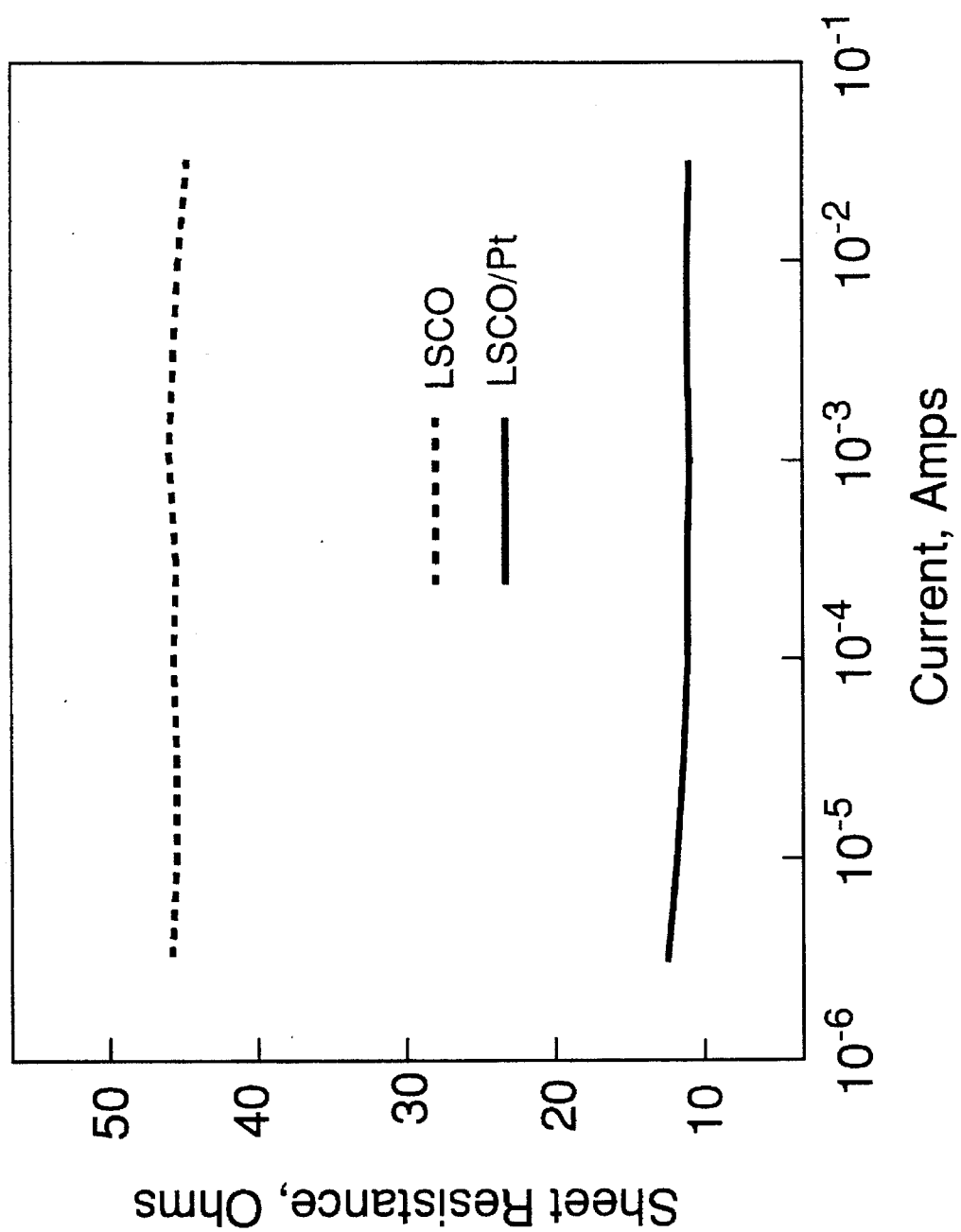
FIG. 4 is a graph of comparative conductivities of ferroelectric heterostructures with and without a platinum ground layer according to the present invention.

Additional heterostructures were grown to provide samples for testing the efficacy of the processing of the present invention. In one set of such samples, a first heterostructure was prepared as described above to include template BTO layer 13 while in a second sample the Pt layer 14 was grown directly on SiO$_2$ layer 12. Respective x-ray diffraction patterns of the samples depicted in FIGS. 2 and 3 show the strong orientation, particularly in the Pt and PLZT layers (FIG. 2), achieved from the use of the template layer, and the weak orientation (FIG. 3) resulting from the growth of Pt on the SiO$_2$. The respective intensities of the patterns are particularly remarkable. A second set of samples differed in the inclusion of Pt layer 14 beneath LSCO electrode 15 of the ferroelectric heterostructure stack. The difference in conductivity (resistance) between these samples is depicted in the traces of FIG. 4.

Figure 5:
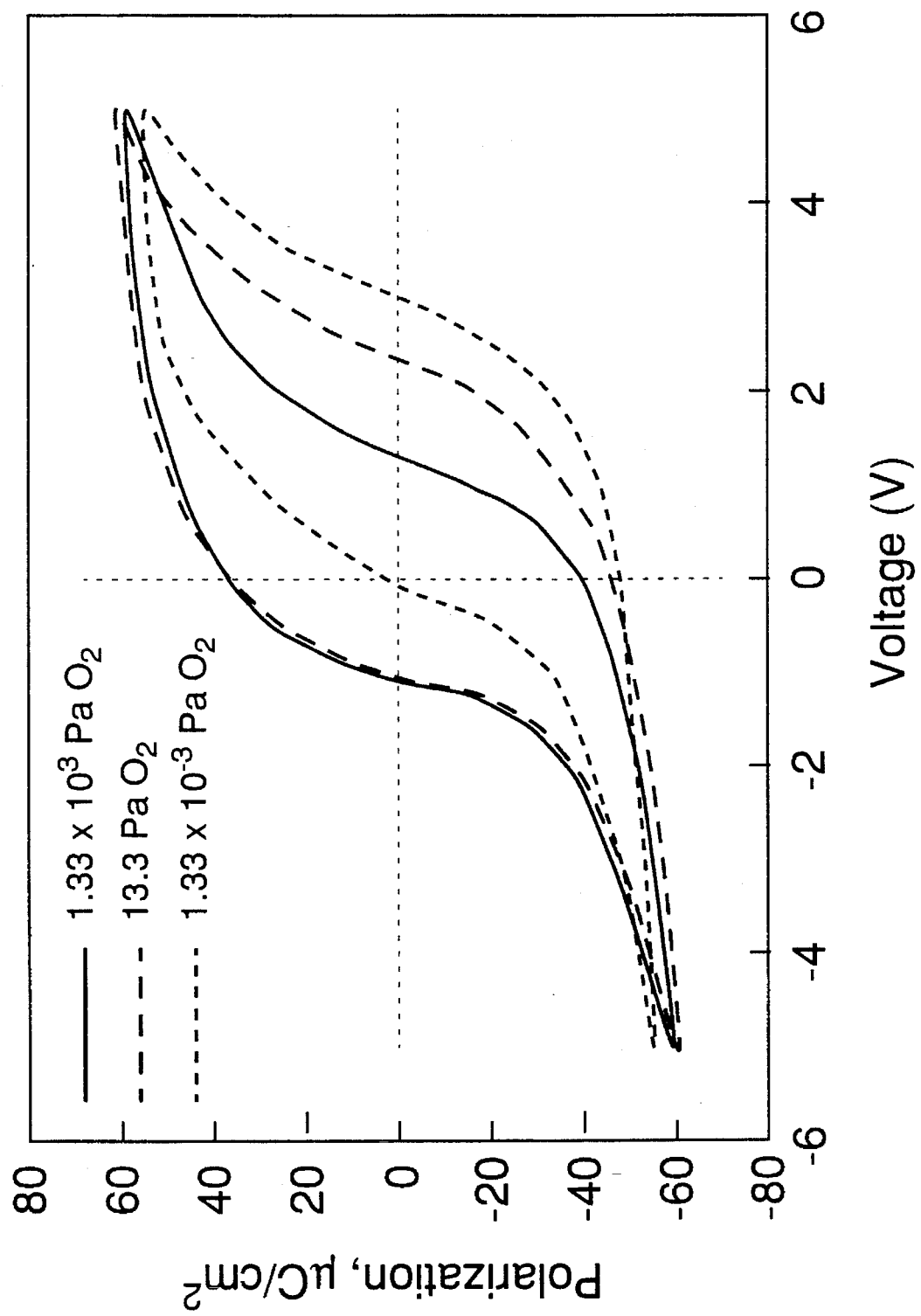
FIG. 5 is a graph of comparative hysteresis loops obtained from testing ferroelectric heterostructures processed in different levels of atmospheric oxygen.

From the results of a series of tests measuring capacitor response after extended periods of dc bias, it was noted that the reliability problem of "imprint", i.e., a predisposition of a layered capacitor to remain in an impressed polarization state, was reflected in asymmetry of measured ferroelectric hysteresis loops of the various heterostructure samples. It was further discovered that such hysteresis asymmetry is influenced by the extent of atmospheric oxygen present during cooling of the heterostructure stack at the conclusion of a fabrication process. This effect can be observed in the comparative hysteresis loops depicted in FIG. 5 which were obtained from measurements of samples cooled in atmospheres varying in oxygen partial pressures below about $1.33 \times 10^3$ Pa. Oxygen partial pressures from about $1 \times 10^2$ Pa to normal atmospheric pressure of about $1 \times 10^5$ Pa during the cooling process provide capacitor heterostructures which do not suffer any significant imprint tendency.

The processes and ferroelectric heterostructure capacitor materials of the present invention have application for a wide range of devices, such as dielectrics for DRAM capacitors, ferroelectric FET elements for non-destructive readout memories, and electro-optic perovskites grown on SiO$_2$/Si substrates for integrated optics, pyroelectric detectors, and the like. Another important aspect of the template growth technique is that the highly-oriented Pt layer will provide the basis for other oriented, and even epitaxial, metallic heterostructures, such as [001] oriented Fe/Pt superlattices for magneto-optic recording in information storage.

Additional devices in the form of magnetoresistive random access memories (MRAM) and magnetic recording and sensing elements may be realized through the integration of ferroelectrics and transistor circuitry enabled by the present invention. These and other applications will become apparent to the skilled artisan in the light of the foregoing description and are to be considered within the scope of the invention as defined in the appended claims.

What is claimed is:

1. A ferroelectric capacitor heterostructure comprising a substrate having a silicon dioxide surface, a substantially c-axis oriented perovskite template layer crystallographically grown on said surface, and at least one ferroelectric layer grown above and orientationally influenced by said template layer characterized in that a layer of metal grown on said template layer provides electrical conductivity for said heterostructure and communicates the orientational influence of said template layer to said at least one ferroelectric layer.

2. A structure according to claim 1 characterized in that said layer of metal consists essentially of platinum.

3. A structure according to claim 1 characterized in that said at least one ferroelectric layer comprises two metallic ferroelectric electrode layers and a perovskite ferroelectric layer disposed therebetween.

4. A structure according to claim 3 characterized in that said metallic ferroelectric electrode layer material is selected from the group consisting of lanthanum strontium cobalt oxide, lanthanum strontium chromium oxide, and strontium rubidium oxide.

5. A structure according to claim 3 characterized in that said perovskite ferroelectric layer is selected from the group consisting of lead lanthanum zirconium titanium oxide, barium titanate, barium strontium titanate, and bismuth titanate.

6. A method of preparing a ferroelectric capacitor heterostructure which comprises growing crystallographically on a substrate having a silicon dioxide surface a substantially c-axis oriented perovskite template layer and growing above said template layer at least one ferroelectric layer orientationally influenced by said template layer characterized in that a layer of metal is grown on said template layer to provide electrical conductivity for said heterostructure and communicate the orientational influence of said template layer to said at least one ferroelectric layer.

7. A method according to claim 6 characterized in that said layer of metal consists essentially of platinum.

8. A method according to claim 6 characterized in that said at least one ferroelectric layer is grown at a temperature in excess of about 600° C. and is cooled from said growth temperature to an operating ambient in an atmosphere comprising a partial pressure of oxygen in excess of about $1 \times 10^2$ Pa.

9. A method according to claim 8 characterized in that said oxygen partial pressure ranges from about $1 \times 10^2$ to about $1 \times 10^5$ Pa.

10. A method according to claim 8 characterized in that said at least one ferroelectric layer comprises two metallic ferroelectric electrode layers and a perovskite ferroelectric layer disposed therebetween.

\* \* \* \* \*